(12) United States Patent
Winkler et al.

(10) Patent No.: US 6,740,889 B1
(45) Date of Patent: May 25, 2004

(54) CHARGED PARTICLE BEAM MICROSCOPE WITH MINICOLUMN

(75) Inventors: Dieter Winkler, München (DE); Hans-Peter Feuerbaum, München (DE); Joseph Bach, Morgan Hill, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/162,103

(22) Filed: Sep. 28, 1998

(51) Int. Cl.[7] .................................................. G01K 5/10
(52) U.S. Cl. ................... 250/441.11; 250/310; 250/311
(58) Field of Search ................................ 250/310, 311, 250/397, 398, 423 F

(56) References Cited

U.S. PATENT DOCUMENTS

| | | | |
|---|---|---|---|
| 4,706,019 A | * 11/1987 | Richardson | 250/310 |
| 4,864,228 A | * 9/1989 | Richardson | 250/311 |
| 4,954,711 A | * 9/1990 | Finkes et al. | 250/423 F |
| 5,122,663 A | 6/1992 | Chang et al. | 250/310 |
| 5,155,412 A | 10/1992 | Chang et al. | 315/14 |
| 5,229,607 A | * 7/1993 | Matsui et al. | 250/306 |
| 5,329,125 A | * 7/1994 | Feuerbaum | 250/442.11 |
| 5,376,792 A | * 12/1994 | Schamber et al. | 250/311 |
| 5,399,860 A | * 3/1995 | Miyoshi et al. | 250/306 |
| 5,502,306 A | * 3/1996 | Meisburger et al. | 250/310 |
| 5,546,337 A | * 8/1996 | Hurt et al. | 365/121 |
| 5,587,586 A | * 12/1996 | Kruit | 250/423 F |
| 5,786,601 A | * 7/1998 | Sturrock et al. | 250/491.1 |
| 5,811,803 A | * 9/1998 | Komatsu et al. | 250/310 |
| 5,831,272 A | * 11/1998 | Utsumi | 250/398 |

FOREIGN PATENT DOCUMENTS

| | | | |
|---|---|---|---|
| JP | 404116843 | * 4/1992 | |
| JP | HEI 11-16967 | 1/1999 | |

OTHER PUBLICATIONS

Chang et al., "Electron beam technology—SEM to microcolumn," *Microelectronic Engineering*, 32 (1996) pp. 113–130.

"Novel High Brightness Minature Electron Gun for High Current E–Beam Applications", Burstert et al., Microelectronics Engineering, 31, 1996, pp. 96–100.

"Miniature Electrostatic Lens for Generation of a Low–Voltage High Current Electron Probe", Bubeck et al, pp. 1–9, 5th International Conference on Charged Particle Optice, Dellft, Apr., 1998.

\* cited by examiner

*Primary Examiner*—Jack Berman
*Assistant Examiner*—Kalimah Fernandez
(74) *Attorney, Agent, or Firm*—Michael B. Einschlag

(57) ABSTRACT

A charged particle beam microscope is described, which is equipped with a minicolumn. Various embodiments are disclosed, suitable for various uses. According to one embodiment the minicolumn is situated inside a minienvironment and can be introduced into and withdrawn from the main vacuum chamber. According to other embodiments, the minicolumn is situated inside the main vacuum chamber. According to further embodiments, a turntable stage is used and the minicolumn is attached to an arm movable in the radial direction of the turntable.

28 Claims, 3 Drawing Sheets

CHARGED PARTICLE BEAM MICROSCOPE WITH MINICOLUMN

BACKGROUND OF THE INVENTION

1. Field of the Invention

The invention relates to charged particle beam microscopes and, particularly, to arrangements for equipping such a microscope with a minicolumn.

2. Discussion of Related Art

Charged particle beam microscopes, such as an electron microscope, are well known in the art, and are widely used during the manufacture of semiconductor wafers. For ease of discussion, the remaining disclosure makes reference to electrons as the charged particles; however, it should be appreciated that the discussion is equally applicable to other charged particles. The elements of a conventional electron microscope which are of particular relevance here are depicted in FIG. 1. Specifically, a vacuum chamber 10 houses an x-y stage 20 upon which the wafer 40 is placed by a robot (not shown). The chamber 10 is evacuated via outlet 70. The wafer 40 is introduced into the chamber 10 via a load lock 30 so as to avoid having to evacuate the chamber 10 each time a wafer is loaded.

An electron column 50 is hermetically attached to the chamber 10. The column 50 houses the electron source and all the necessary electron optics (not shown). The column 50 is evacuated via outlet 60. The diameter of a conventional column is roughly 6–10 inches, while its height is roughly 15–30 inches. The conventional column is capable of providing an electron beam of sufficiently small diameter for wafer and reticle inspection, review and metrology.

One disadvantage of the prior art design is that whenever the column requires a repair which necessitates its removal from the chamber or breaking the vacuum in the column, the vacuum of the chamber is also broken. Breaking the vacuum in the chamber necessarily means that the microscope will be out of service for several hours. Another disadvantage is the requirement for separate vacuum systems for the column and the chamber, which increases the complexity and price of the system, while adversely affecting its reliability and stability.

Recently, a new type of column has been developed, and is generally referred to as a "minicolumn." A cross section of a minicolumn investigated by the current inventors is depicted in FIG. 2. In FIG. 2, element 200 is the electron source (preferably a Schottky emitter), 210 is an aperture (suppressor), and 220 generally designates the lens arrangement. More specifically, lens arrangement 220 comprises three lenses 230 made of a conductive material and insulating spacers 240 interposed between the lenses 230. Ordered from the emitter, the lenses 230 comprise an extraction lens, a focusing lens, and an acceleration lens, respectively.

Notably, the diameter and height of such a column is measured in single-digit centimeters. More specifically, the diameter of the lens arrangement depicted in FIG. 2 is on the order of 3 centimeters, while its height is on the order of 1 centimeter. While this column is remarkably smaller than the conventional column, it provides an electron beam which has small diameter and was determined by the present inventors to be suitable for use in electron microscopes. Further information regarding the study of the minicolumn is presented in F. Burstert, D. Winkler and B. Lischke, Microelectronic Engineering 31 (1996) 95; and in Miniature Electrostatic Lens for Generation of a Low-Voltage High Current Electron Probe, C. D. Bubeck, A.; Fleischmann, G. Knell, R. Y. Lutsch, E. Plies and D. Winkler, Proceedings of the. Charged Particle Optics Conference, Apr. 14–17, 1998.

SUMMARY OF THE INVENTION

Accordingly, the present invention provides arrangements for installing minicolumns onto a charged particle microscope, especially electron microscopes, to while providing synergistic advantages over the prior art column arrangement. That is, the disclosed arrangements provide advantages in addition to the advantages of the minicolumn per se.

According to one set of embodiments of the invention, a second load lock is provided on the microscopes vacuum chamber. The second load lock is used to introduce the minicolumn into the chamber without having to break the vacuum in the chamber. Thus, a technician can replace the minicolumn without having to break the vacuum in the chamber.

According to another set of embodiments, the minicolumn is situated inside the microscope's vacuum chamber. While this arrangement necessitates breaking the vacuum for each minicolumn service, is still advantageous in that here is no need for separate vacuum system for the column. This is advantageous especially if more than one minicolumn is used inside the chamber.

Another advantage of the invention is that it provides arrangements for more than one minicolumn per microscope. This arrangement is especially advantageous for taking multiple perspectives simultaneously or for increasing the throughput.

BRIEF DESCRIPTION OF THE DRAWINGS

FIG. 3A depicts an embodiment of an isolation valve arrangement in a closed position, while

FIG. 5A depicts an embodiment of a minicolumn within the microscope chamber, while FIG. 5B depicts an embodiment of a plurality of minicolumns arranged inside the chamber, at different angles.

FIG. 7A depicts an arrangement of an arm having a plurality of minicolumns situated at different angles advantageous for defect review, while

DETAILED DESCRIPTION OF THE PREFERRED EMBODIMENTS

Figure 1:
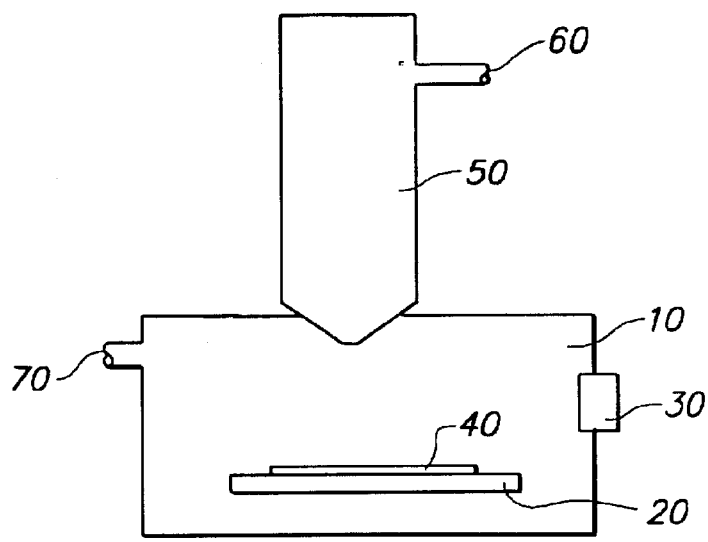
FIG. 1 depicts relevant elements of a conventional electron microscope.
Figure 2:
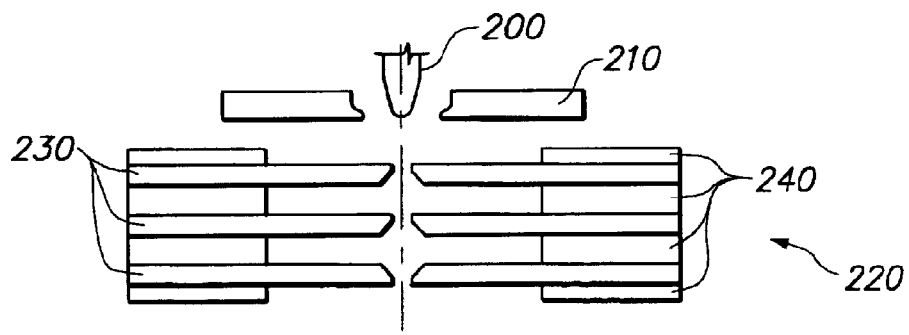
FIG. 2 depicts a lens arrangement of a minicolumn investigated by the present inventors.
Figure 3A:
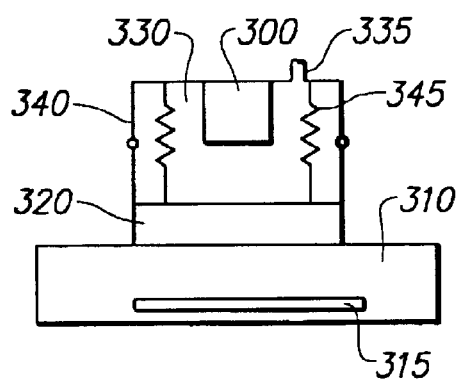
Figure 3B:
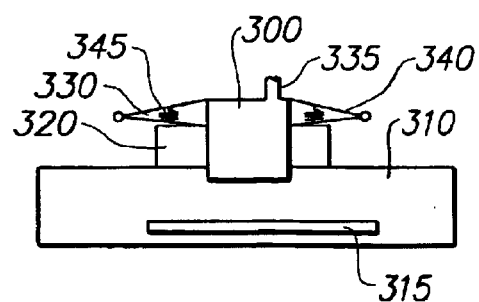
FIG. 3B depicts the arrangement of FIG. 3A in an open position.

FIGS. 3A and 3B depict a first embodiment of an isolation valve for the minicolumn 300 Specifically, the vacuum chamber 310 is equipped with a valve 320 capable of hermetically sealing chamber 320 in the closed position. Minicolumn 300 is positioned inside a mini-environment chamber 330, which can be evacuated via outlet 335. In the exemplified embodiment, the mini-environment chamber 330 has collapsible walls 340, which are actuated by bellows 345. However, it should be appreciated that other solutions having rigid walls with means for elevating and lowering the columns are also workable.

During maintenance, the mini-environment chamber 330 is in its closed position. In the closed position, exemplified in FIG. 3A, the bellows 345 are extended so as to raise the walls 340 to upright position. In this upright position, the minicolumn is extruded from the chamber 310 and valve 320 is closed to maintain the vacuum level inside the chamber 310. When maintenance is completed, the mini-environment chamber 330 can be evacuated via outlet 335 and, when the evacuation is completed, the valve 320 can be opened and the minicolumn lowered to the chamber 310.

Specifically, FIG. 3B exemplifies the situation during operation of the microscope. When the mini-environment chamber 330 has been evacuated and the valve 320 opened, the bellows collapse the walls 340 so as to introduce the minicolumn into the chamber 310, close to the stage 315. Unless the minicolumn malfunctions, there is not need to revert to the position shown in FIG. 3A, and the microscope can be maintained in the position shown in FIG. 3B. However, if the minicolumn requires maintenance or replacement, the bellows 345 are extended to raise the walls 340 and extrude the minicolumn 300 from chamber 310; the valve 320 is closed; and the mini-environment chamber 330 is brought to atmospheric pressure via outlet 335.

Figures 4A, 4B:
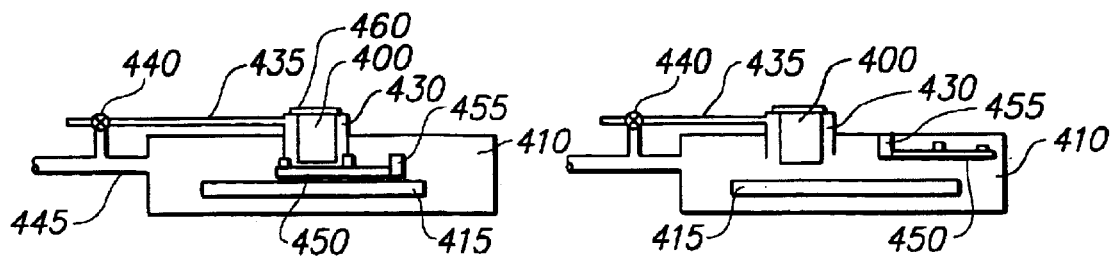
FIG. 4A depicts another embodiment of an isolation valve in a closed position.
FIG. 4B depicts the embodiment of FIG. 4A in an open position.

Another embodiment for isolation valve is depicted in FIGS. 4A and 4B. Minicolumn 400 is situated inside a mini-environment chamber 430 that is open at its bottom to chamber 410. Mini-environment chamber 430 has an outlet 435 which, in this example, is connected to the outlet 445 via vacuum valve 440. Thus, mini-environment chamber 430 and chamber 410 can be connected to the same vacuum pump (not shown). However, it should be appreciated that outlet 435 can be connected independently to a separate vacuum pump. Isolation valve 450 is pivoted on shaft 455, which is capable of elevation motion, i.e., in the Z direction.

During operation (depicted in FIG. 4B), isolation valve 450 is swiveled away from the opening of mini-environment chamber 430, and the shaft 455 is in its upper-most position so as to place the isolation valve 450 out of the working area of the microscope. Preferably, stage 415 is equipped with actuators for Z motion so that during operation the distance between the minicolumn and the specimen can be adjusted for proper imaging. Such stages are well known in the art and will not be described here. If the outlet arrangement depicted in FIG. 3B is used, then during operation valve 440 can be maintained open so that vacuum pump operation maintains vacuum in both chambers 410 and 430.

When access to the minicolumn is required, the stage is lowered and the valve 450 is brought to its close position. For that operation, preferably the shaft 455 is lowered to its lowest position, the valve 450 is swiveled to its closed position and the shaft 455 is elevated sufficiently to cause an hermetic seal between the valve 450 and the opening of the mini-environment chamber 430. Then valve 440 can be moved to the open position so that mini-environment chamber 430 is brought to atmospheric pressure. Then the back plate 460 can be removed for access to the minicolumn. Preferably, the minicolumn itself is secured to the back plate 460, so that it is removed together with the back plate 460.

Figures 5A, 5B:
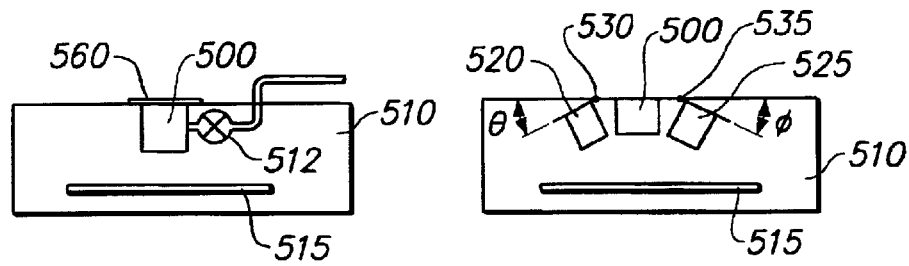

FIG. 5A depicts an arrangement of a minicolumn enclosed within the microscope chamber. Specifically, minicolumn 500 is positioned completely inside the chamber 510, so that no separate evacuation is necessary for the minicolumn 500. Preferably the stage 515 is capable of elevation motion to control the distance between the minicolumn 500 and the specimen. Here again, it is preferred that the minicolumn be attached to a back plate 560, so that removal of the back plate 560 would remove the minicolumn 500 as well. Such an arrangement is particularly useful for metrology, such as for critical dimension (CD) measurement microscopes. Also exemplified in FIG. 5A is an in-chamber integrated vacuum pump, which controls the vacuum inside the minicolumn 500.

Electron microscopes can also be used for review of locations on wafers which are suspected of having defects thereupon. In such application, it is particularly useful to be able to scan the suspect area at different angles. A particularly elegant way of doing so using a conventional column is described in U.S. Pat. No. 5,329,125 to Feuerbaurn. In that patent, a system is disclosed which is capable of placing the column at any tilt between 0–45 degrees, without breaking the vacuum inside the column or the microscope chamber. Thus, one can take a picture at 0 tilt, and then tilt the column to a desired position and take another picture for added information. Notably pictures taken at a tilt tend to have more topographic information than those taken without tilt.

FIG. 5B exemplifies a system having a plurality of minicolumns, and particularly suitable for an electron microscope review station. As shown in the Figure, a first minicolumn 500 is situated inside the chamber at zero tilt. A second minicolumn 520 is positioned at a first tilt θ and a third minicolumn is positioned at a second tilt φ. In the preferred embodiment, the tilt angles θ and φ are fixed and different from each other. Preferably the tilts are fixed at 30 and 60 degrees, respectively, or 30 and 45 degrees, respectively. However; as shown in FIG. 5B, the tilts can be variable by, for example, pivoting the columns 520 and 525 about pivots 530 and 535, respectively.

It is well known that chamber size directly affects the quality of the vacuum maintained within the chamber and, consequently, can affect the reliability and "cleanliness" of the equipment. Additionally, large chambers require a large footprint, which is of paramount consideration for fabrication plants, wherein clean-room real estate is at a premium. However, x-y stages generally require large chambers since they require motion space that is at least twice the size of the largest specimen to be inspected. Considering that the semiconductor industry is moving towards a 300 mm wafers, an x-y stage for such wafer can dictate a very large footprint.

Figure 6A:
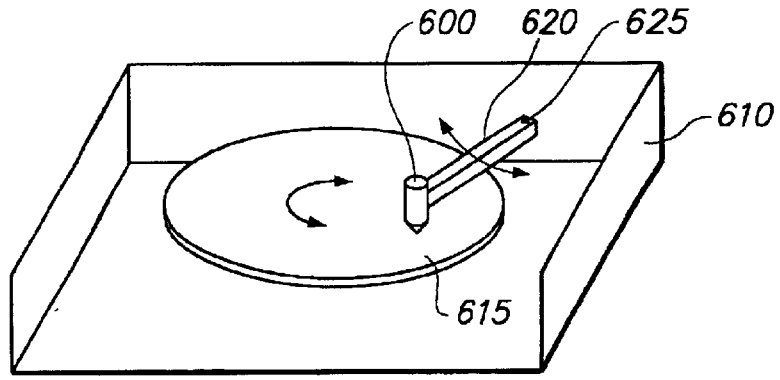
FIGS. 6A and 6B depict embodiment using a turntable stage for reduced footprint.
Figure 6B:
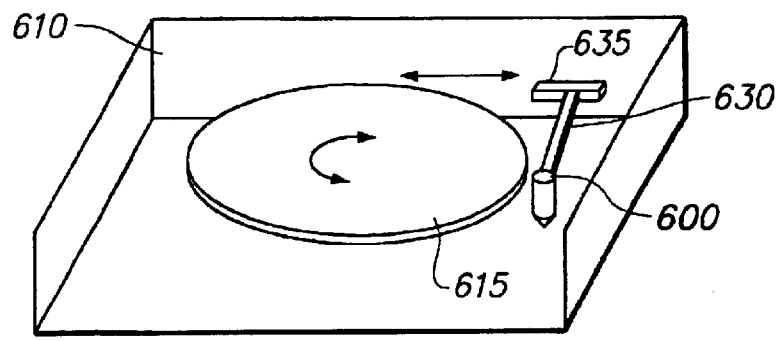

FIGS. 6A and 6B depict embodiments which are particularly advantageous for reducing the footprint of the microscope. Specifically, FIGS. 6A and 6B depicts a minicolumn 600 attached to an arm 620, which is situated inside the chamber 610. Rather than an x-y stage, a turntable stage 615 is used. In FIG. 6A the arm 620 is pivoted about pivot 625, while in FIG. 6B the arm is attached to a linear carriage 635. In both cases, the arms 620 are capable of moving the minicolumn 600 through the entire radius of the stage 615. Through the rotational motion of the turntable stage 615, and the motion of the arm 630 (whether radial or linear), every location on the specimen can be reached in polar (r,θ) coordinates.

Figure 7A:
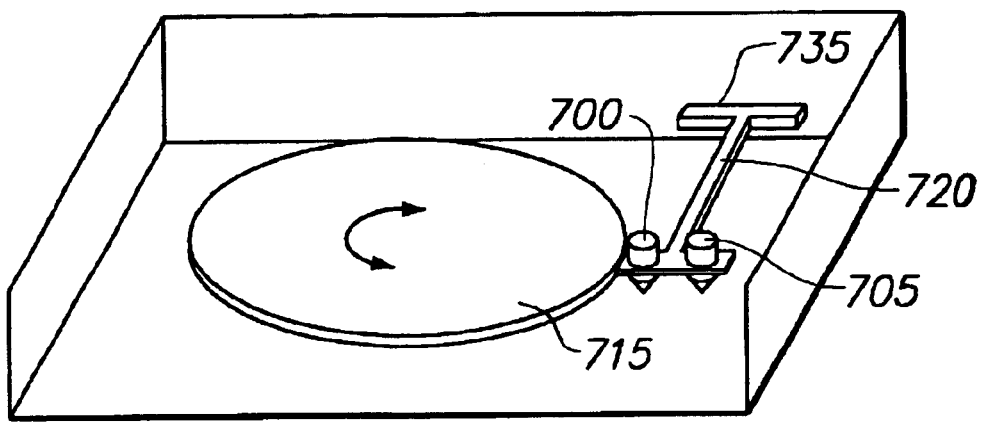

As noted above, it is desirable to be able to obtain images of the same spot using tilt. FIG. 7A depicts a turntable arrangement similar to that depicted in FIG. 6B, except that the arm 720 carries two minicolumns 700 and 705. In the exemplified embodiment, minicolumn 700 is situated with zero tilt, while minicolumn 705 is, situated with a fixed tilt, preferably of 30 or 45 degrees. However, it should be appreciated that more than two minicolumns can be provided, and that the tilt can be variable rather than fixed.

It is also known to use electron microscopes to inspect wafers and reticles for defects. An exemplary system is disclosed in U.S. Pat. No. 5,502,306 to Meisburger et al. That system uses a single conventional column to scan the entire wafer/reticle for defects. The system is sold under the name of SEMSpec by KLA of San Jose/Calif. and is known to have a very slow throughput.

Figure 7B:
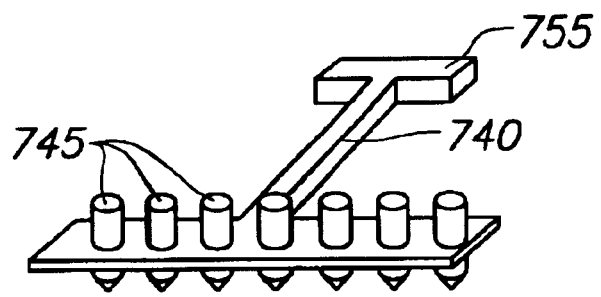
FIG. 7B depicts an arm having a plurality of minicolumns at a single angle advantageous for sector-wise inspection.

FIG. 7B depicts an arm 740 structured to support a plurality of columns 745 positioned with zero tilt. The arm 740 is attached to a linear carriage 755. Such an arm can be installed in a chamber having a turntable stage for inspecting an entire wafer for defects. Specifically, the wafer is divided to concentric sectors corresponding to the number of minicolumns 745 attached to arm 740. Thus, as the wafer is rotated, the carriage 755 need travel only a length equal to the radial length of one sector. During such motion, each minicolumn 745 would scan its corresponding sector, thereby covering the entire wafer. Of course, an small overlap may be provided to ensure complete coverage.

While the invention has been described with reference to particular embodiments thereof, it should be appreciated that that other embodiments and modifications can be implemented without departing from the spirit and scope of the invention as defined by the appended claims.

What is claimed is:

1. An electron microscope, comprising:
a main vacuum chamber housing a stage therein and connected to a vacuum pump;
a load lock for loading a specimen into said main vacuum chamber,
a minicolumn for inspecting said specimen and,
a mini-environment chamber housing said minicolumn and being capable of isolating said minicolumn from said main vacuum chamber.

2. The electron microscope of claim 1, wherein said mini-environment comprises an opening to the main chamber for introducing said minicolumn into the main vacuum chamber and extracting said minicolumn form said main vacuum chamber.

3. The electron microscope of claim 1, wherein said mini-environment comprises a bellows structure for introducing said minicolumn into the main vacuum chamber and extracting said minicolumn form said main vacuum chamber.

4. The electron microscope of claim 1, wherein said mini-environment comprises an evacuation outlet.

5. The electron microscope of claim 1, wherein said mini-environment comprises a second chamber having an opening into said main chamber, and a valve structure for hermetically sealing said opening.

6. The electron microscope of claim 5, wherein said valve comprises a sealing plate that is pivoted on a shaft, which shaft is capable of elevation motion.

7. An electron microscope for inspection of a semiconductor wafer comprising:
a main vacuum chamber housing a stage therein and connected to a vacuum pump,
a load lock for loading said wafer into said main vacuum chamber;
a turntable stage for placing said wafer thereupon;
a mounting arm positioned inside said main vacuum chamber, said mounting arm having a motion mechanism imparting one of rotational or linear translational motion to the mounting arm; and
a minicolumn non-translatably mounted on said mounting arm inside said main vacuum chamber;
wherein inspection of every point upon said wafer is enabled by the turntable rotating the wafer, and the mounting arm translating or rotating the minicolumn.

8. The electron microscope of claim 2, further comprising a removable back plate attached to said main chamber, and wherein said minicolumn is connected to the removable back plate.

9. The electron microscope of claim 7, further comprising at least one tilted minicolumn mounted on said mounting arm at a tilt with respect a to a perpendicular to a surface of the stage.

10. The electron microscope of claim 9, wherein the tilt of said tilted minicolumn is variable.

11. The electron microscope of claim 7, further comprising a radial pivot, and wherein said mounting arm is connected to said radial pivot.

12. The electron microscope of claim 7, further comprising a linear motion carriage, and wherein said mounting arm is connected to said linear motion carriage.

13. The electron microscope of claim 7, further comprising at least one additional minicolumn connected to said mounting arm.

14. The electron microscope of claim 13, wherein said at least one additional minicolumn has a tilt with respect to a perpendicular to a surface of the turntable stage.

15. The electron microscope of claim 14, wherein the tilt is variable.

16. An electron microscope, comprising:
a main vacuum chamber housing a stage therein and connected to a vacuum pump;
a lead lock for loading a specimen into said main vacuum chamber;
a plurality of minicolumns; and
a mini-environment chamber housing said minicolumns and being capable of isolating said minicolumns from said main vacuum chamber.

17. The electron microscope of claim 16, wherein said mini-environment comprises an opening to the main chamber for introducing said minicolumns into the main vacuum chamber and extracting said minicolumns from said main vacuum chamber.

18. The electron microscope of claim 16, wherein said mini-environment comprises a bellows structure for introducing said minicolumns into the main vacuum chamber and extracting said minicolumns form said main vacuum chamber.

19. An electron microscope for semiconductor wafer inspection, comprising:
a main vacuum chamber connected to a vacuum pump and housing;
a turntable stage for holding said wafer thereupon;
a holding arm capable of one of translational or rotational motion; and,
a plurality of minicolumns attached to said holding arm;
wherein inspection of every point upon said wafer is enabled by the turntable rotating the wafer, and the holding arm translating or rotating the minicolumns.

20. The electron microscope of claim 19, wherein at least one of said minicolumns has a tilt with respect to a perpendicular to a surface of the stage.

21. The electron microscope of claim 20, wherein said tilt is variable.

22. The electron microscope of claim 1 wherein the mini-environment further comprises a back plate.

23. The electron microscope of claim 22 wherein the minicolumn is connected to the back plate.

24. The electron microscope of claim 5 wherein, the mini-environment further comprises a back plate.

25. The electron microscope of claim 24 wherein the minicolumn is connected to the back plate.

26. The electron microscope of claim 7 wherein the minicolumn is disposed at a tilt with respect to a perpendicular to a surface of the stage.

27. The electron microscope of claim 26 wherein the tilt is variable.

28. An electron microscope for inspection of a semiconductor wafer, comprising:

a main vacuum chamber housing a stage therein and connected to a vacuum pump;

a load lock for loading said wafer into said main vacuum chamber;

a turntable stage for placing said wafer thereupon;

a mounting arm positioned inside said main vacuum chamber, said mounting arm having a motion mechanism imparting rotational motive to the mounting arm in a plane parallel to a surface of the turntable stage; and a minicolumn non-translatably mounted in said mounting arm inside said main vacuum chamber, wherein inspection of every point upon said wafer is enabled by the turntable rotating the wafer, and the mounting arm rotating the minicolumn.

* * * * *